(12) United States Patent
Hofmann et al.

(10) Patent No.: US 9,753,280 B2
(45) Date of Patent: Sep. 5, 2017

(54) MICROMIRROR ARRANGEMENT

(71) Applicant: Fraunhofer-Gesellschaft zur Förderung der angewandten Forschung e.V., München (DE)

(72) Inventors: Ulrich Hofmann, Itzehoe (DE); Frank Senger, Hardenfeld (DE); Thomas von Wantoch, Kiel (DE); Christian Mallas, Schwentinental (DE); Joachim Janes, Itzehoe (DE)

(73) Assignee: FRAUNHOFER-GESELLSCHAFT ZUR FÖRDERUNG DER ANGEWANDTEN FORSCHUNG E.V., München (DE)

( * ) Notice: Subject to any disclaimer, the term of this patent is extended or adjusted under 35 U.S.C. 154(b) by 0 days.

(21) Appl. No.: 15/037,509

(22) PCT Filed: Nov. 24, 2014

(86) PCT No.: PCT/EP2014/075380
§ 371 (c)(1),
(2) Date: May 18, 2016

(87) PCT Pub. No.: WO2015/075222
PCT Pub. Date: May 28, 2015

(65) Prior Publication Data
US 2016/0299335 A1    Oct. 13, 2016

(30) Foreign Application Priority Data
Nov. 22, 2013    (DE) .......................... 10 2013 223 933

(51) Int. Cl.
*G02B 26/08*    (2006.01)
*G02B 26/10*    (2006.01)
*B81B 3/00*    (2006.01)

(52) U.S. Cl.
CPC .......... *G02B 26/101* (2013.01); *B81B 3/0043* (2013.01); *G02B 26/0833* (2013.01);
(Continued)

(58) Field of Classification Search
CPC ............ G02B 26/0833; G02B 26/0841; G02B 26/101; G02B 26/10; G02B 26/105;
(Continued)

(56) References Cited

U.S. PATENT DOCUMENTS

| 5,543,956 A | 8/1996 | Nakagawa et al. |
| 7,295,726 B1 | 11/2007 | Milanovic et al. |

(Continued)

FOREIGN PATENT DOCUMENTS

| EP | 2503681 | 9/2012 |
| WO | WO-2015075222 | 5/2015 |

OTHER PUBLICATIONS

"International Application No. PCT/EP2014/075380, International Preliminary Report on Patentability mailed Jun. 2, 2016", (Jun. 2, 2016), 12 pgs.

(Continued)

*Primary Examiner* — Euncha Cherry
(74) *Attorney, Agent, or Firm* — Schwegman Lundberg & Woessner, P.A.

(57) ABSTRACT

What is proposed is: a micromirror arrangement which comprises: a first spring-mass oscillator, which has an oscillatory body forming a mirror plate (1) and first spring elements (2); a second spring-mass oscillator, which has a drive plate (3) and second spring elements (4) and which is connected to a carrier arrangement (5, 8, 9) via the second spring elements (4), wherein the first spring-mass oscillator is suspended in the second spring-mass oscillator via the first spring elements (2); and a drive arrangement (11), which is assigned to the drive plate and is designed to cause the drive (Continued)

plate (3) to oscillate. The oscillatory body (1) is suspended, movably on two axes, via the first spring elements (2) on the drive plate (3), and the drive plate (3) is connected, movably on two axes, to the carrier arrangement (5, 8, 9), wherein the drive arrangement (11) is embodied as a two-axis drive and is designed to drive the drive plate (3) on two axes such that the oscillatory body (1) oscillates on two axes at in each case one of its orthogonal eigenmodes or close to this eigenmode.

14 Claims, 5 Drawing Sheets

(52) U.S. Cl.
CPC .... *G02B 26/0841* (2013.01); *B81B 2201/042* (2013.01); *B81B 2203/0163* (2013.01); *B81B 2203/058* (2013.01)

(58) Field of Classification Search
CPC ....... G02B 26/085; B81B 3/00; B81B 3/0043; B81B 2201/042; B81B 2203/058
USPC ...................... 359/212.1–214.1, 223.1–226.1
See application file for complete search history.

(56) References Cited

U.S. PATENT DOCUMENTS

| | | | |
|---|---|---|---|
| 2007/0139752 A1 | 6/2007 | Bernstein et al. | |
| 2012/0206782 A1* | 8/2012 | Chan ................. | G02B 26/0833 359/199.2 |
| 2012/0307211 A1* | 12/2012 | Hofmann ............. | G02B 26/101 359/213.1 |

OTHER PUBLICATIONS

"International Application No. PCT/EP2014/075380, International Search Report and Written Opinion mailed Jan. 23, 2015", (Jan. 23, 2015), 12 pgs.

Schenk, Harald, et al., "Design and modeling of large deflection micromechanical 1D and 2D scanning mirrors", Proc. SPIE 4178, MOEMS and Miniaturized Systems, vol. 4178, 116 (Aug. 22, 2000), (Aug. 22, 2000).

* cited by examiner

MICROMIRROR ARRANGEMENT

PRIORITY APPLICATIONS

This application is a U.S. National Stage Filing under 35 U.S.C. 371 from International Application No. PCT/EP2014/075380, filed on 24 Nov. 2014, and published as WO 2015/075222 on 28 May 2015, which claims the benefit of priority to German Application No. 10 2013 223 933.5, filed on 22 Nov. 2013; which applications and publication are incorporated herein by reference as if reproduced herein and made a part hereof in their entirety, and the benefit of priority of each of which is claimed herein.

TECHNICAL FIELD

The invention relates to a micromirror arrangement according to the preamble of main claim.

BACKGROUND

An as large as possible mirror diameter, e.g. larger than 7 millimeters, an as high as possible resonant frequency, i.e. high scanning frequencies, e.g. greater than 7 kilohertz, and an as large as possible deflection angle, e.g. larger than 10°, are simultaneously desired for numerous applications of micromirror arrangements.

A micromirror arrangement, with which a single-axis spring-mass oscillator is suspended in a further spring-mass oscillator is known from U.S. Pat. No. 5,543,956. Thereby, a drive unit which excites the further spring-mass oscillator into oscillation is assigned to the further spring-mass oscillator, by which means the suspended single-axis spring-mass oscillator is likewise excited into oscillation. The single-axis spring-mass oscillator comprises an oscillation body which is designed as a mirror and which is suspended on a drive plate of the further spring-mass oscillator via torsion springs, and this drive plate in turn is connected to a stationary part via torsion springs. A resonant oscillation of the single-axis spring-mass oscillator which is designed as an inner mirror oscillator and whose amplitude has a large deflection angle and is significantly increased with respect to the surrounding drive plate, can be realised given a suitable design of the moments of inertia and spring stiffnesses of the spring-mass oscillators as well as with a suitable selection of the activation frequency for the drive of the further spring-mass oscillator.

Such micromirror arrangements which are known from the state of the art and which are applied as so-called MEMS scanners are all limited to only single-axis systems. However, a resonant oscillation in two axes perpendicular to one another, e.g. for Lissajous laser projection displays, is desirable for numerous tasks.

Biaxial resonance scanners with a biaxial amplitude amplification are to be found in literature only to a limited extent. Schenk et al. in the article "Design and Modeling of Large Deflection Micromechanical 1D and 2D Scanning Mirrors", Proceedings of SPIE, vol. 4178 (2000) describes a cardanically suspended biaxially resonant 2D scanner which has a mirror diameter of less than 2 millimeters. This approach, based on electrostatic comb drives would lead to an extremely disadvantageously enlarged component for large mirrors, for example for mirrors with 7 millimeters and larger, and this component would then only have very low dynamics due to the scaling of the electrostatic forces.

A different approach is described in U.S. Pat. No. 7,295,726 B1. The biaxial scanner which is known from this makes do without a cardanic suspension and utilises four identical lever connections between the scanner chip flame and a mirror plate. The electrode distances can be kept small with this biaxial scanner, but an unfavourable scaling behaviour of the electrostatic force also occurs with this approach.

SUMMARY

It is therefore the object of the invention, to provide a biaxial micromirror arrangement for use in a biaxial resonance scanner, which permits a large deflection angle, e.g. larger than 10°, in the two oscillation axes which are perpendicular to one another, and with which the oscillation body designed as a mirror plate can be designed as largely as possible, i.e. with a mirror diameter of >7 mm.

According to the invention, this object is achieved by the characering features of the main claim in combination with the features of the preamble.

Advantageous further developments and improvements are possible by way of the measures specified in the dependent claims.

The micromirror arrangement according to the invention comprises a first spring-mass oscillator, said first mass spring oscillator having an oscillation body forming a mirror plate, and first spring elements; and a second spring-mass oscillator which has a drive plate and second spring elements and is connected to a carrier arrangement via the second spring elements. Thereby, the first spring-mass oscillator is suspended in the second spring-mass oscillator via the first spring elements, and moreover a drive arrangement is provided, which is assigned to the drive plate and is designed to excite the drive plate into oscillation. The oscillation body is movably suspended on the drive plate in a biaxial manner via the first spring elements, and the drive plate is connected to the carrier arrangement in a biaxially moveable manner, and the drive arrangement is designed as a biaxial drive and is designed to drive the drive plate in a biaxial manner such that the oscillation body oscillates in a biaxial manner in each case with one of its eigenmodes or close to these eigenmodes (depending on the resonant frequency, between plus minus 1%-plus minus 10% of the resonant frequency), i.e. with two eigenmodes which are orthogonal to one another or close to these eigenmodes, for one rotation axis in each case.

It is possible to set the oscillation body, i.e. the mirror plate, into oscillations of a large amplitude by way of the drive arrangement, via the outer, second spring-mass oscillator, even if it is the case of a large oscillation mass and moment of inertia of the oscillation body, wherein such a large mass and moment of inertia cannot normally be meaningfully realised for MEMS resonators or MEMS scanners; or however it is the case of very high frequencies, wherein this possibility is due to the fact that both axes of the micromirror arrangement according to the invention are realised by a cascaded spring-mass system, by way of an arrangement of a double resonator in a double resonator. The drive parameters of the drive arrangement for the two axes, such as drive frequency and drive amplitude, are matched to the parameters of the first and second spring-mass oscillator, such as the moment of inertia and spring stiffness, in a manner selected such that the drive plate of the second spring-mass oscillator moves with a reduced excitation amplitude, but a larger amplitude amplification or angle-amplitude amplification in relation to the oscillation body of the first spring-mass oscillator is achieved in both axes.

Oscillation amplitudes in axes perpendicular to one another, and which are greater than can be released with arrangements known until now in micro-technology, by a factor of 10 to 1000, can be achieved with the micromirror arrangement according to the invention, with respect to MEMS mirrors with diameters above 5 mm and a resonant frequency of greater than 2 kHz.

It is particularly advantageous that the drive arrangement is designed to drive the drive plate such that the oscillation body and the drive plate oscillate in a counter-phased manner, i.e. the two axes are decoupled from one another and are activated at two different frequencies. This is particularly advantageous for achieving large amplitudes or large angular amplitudes. As the case may be, e.g. with a circular scanning, one can however envisage a coupling between the axes, and the drive frequencies are selected equally or similarly.

As already mentioned, the arrangement according to the invention relates to a double resonator approach which is realised in two axes perpendicular to one another and with which in each case an outer resonator (second spring-mass oscillator) brings an inner resonator (first spring-mass oscillator) into oscillation. The damping of inner resonator, of the mirror oscillator, can be minimised due to the fact that the inner resonator does not have its own drive structures. The double resonator has two resonant frequencies in each of the two oscillation axes. The resonators can be designed such that both resonators oscillate in an equal-phased manner given a first lower resonant frequency, and both oscillate counter-phased to one another given a higher, second resonant frequency. A desired amplitude amplification of the inner oscillator is obtained given a suitable design of spring strengths and moments of inertia, i.e. the mirror has much greater oscillation angle amplitude than the drive frame. The amplification factor typically lies between 10 and 200. It can be necessary, depending on the set task, to realise two oscillation axes which are decoupled as completely as possible, or however to realise two axes which preferably have a certain coupling and mutual synchronisation. Two specific application examples are mentioned concerning this:

If, with a first example, it is the task of rectangularly illuminating a projection surface with regard to its extension with the help of a resonance scanner which oscillates in two axes and is with a diameter of 7 mm or larger, e.g., in order with this, to guide a powerful UV laser via a phosphor luminescent layer in a motor vehicle projection headlight, then one hereby strives for a decoupling of the two axes, in order with this for example to permit the first axis to oscillate e.g. at 10.0 kHz and the second axis at 10.2 kHz. A repetition rate of the Lissajous trajectory of 200 Hz can be produced in this manner (a frequency which the human eye is no longer cable of resolving). If the axes were to be coupled too greatly, then a constant energy exchange would occur, and this would be rendered noticeable by an undesirable beat effect. The coupling and decoupling of the two axes depends greatly on the design of the springs. A coupling of the axes mostly cannot be avoided if the spring stiffness exhibits a non-linear behaviour. However, a decoupling of the two axes can then be created if the actuator can be operated such that the springs do no depart from the linear region.

If, with regard to a second example, it is the aim of producing a circular scan trajectory with the help of a resonance scanner oscillating in two axes, for example in order with this to realise an omnidirectional LIDAR distance sensor, or in order, with a high power laser, to solve a circular material machining task, it is then necessary to realise two equal resonant frequencies and to moreover ensure that the two oscillation axes in steady state permanently oscillate with the same oscillation frequency in the correct phase relationship of 90° phase difference. This can be achieved by way of permitting a coupling between the axes in a targeted manner, such as by way of a spring with a low torsion component and high bending component being used. Bending springs often have a significantly lower linear region of the spring stiffness than torsion springs. Both axes have the same frequency responses of the drive plate and mirror. An amplitude frequency resonance with a greatly non-symmetrical resonance course is typical for the non-linear spring stiffness.

The drive plate of the second spring-mass oscillator is advantageously designed as a ring frame which surrounds the oscillation body and which can be realised in a round or polygonal manner according to the desired design. This results in a simple and clear realisation possibility.

In a further embodiment example, the drive plate can comprise several, drive plate elements or drive plate segments which simultaneously form the second spring elements. Such an arrangement provides a very good thermal coupling, which e.g. is necessary with laser material machining with laser powers of up to several kilowatts. Thereby, the absorbed laser energy which is incorporated into the mirror should be led away as well as possible to the periphery of the MEMS chip. Moreover, greater spring stiffnesses can be realised with this embodiment, and these greater spring stiffnesses are significant for realising scanners with very high resonant frequencies. An improved separation of the axes results by way of the "segmentation" of the drive plate. With a non-segmented drive plate, it can occur that the one axis is coupled to the other axis via the drive plate, and specifically to a greater extent, the larger is the deflection of the drive plate and the less spring frames (see below) are intermediately arranged between the mirror plate and the drive plate.

The oscillation body is advantageously suspended on the drive plate or the drive plate segments via four discrete first springs, for realising the two oscillation axes, but it is also conceivable for only three discrete first spring elements to connect the oscillation body to the drive plate, and for the oscillation body to oscillate in a biaxial manner despite this. In a corresponding manner, the drive pivot can be connected to the carrier arrangement via at least two, preferably three or four discrete second spring elements. With a single pair of lateral second springs lying opposite one another, these could e.g. have a meandering shape, which permits a rotation of the drive plate about a first and well as a rotation about the second axis.

In a preferred embodiment example, the first spring elements are designed as at least two annular spring frames. Thereby, the several, preferably three or four or even more spring frames can be nested in one another, and between the oscillation body and the drive plate surround the oscillation body, by which means a cardanic suspension is formed. They are connected in each case to the oscillation body, connected amongst one another and connected to the drive plate, at least at two connection locations lying opposite one another, wherein the connection locations from the oscillation body to the drive plate are arranged offset by an angle between 90 and 120°, preferably by 90°. The dynamic deformation of the oscillation body or of the mirror plate is reduced by way of this arrangement, in particular with regard to the rotation about two rotation axes which are perpendicular to one another. The deformations occur essentially only on the surrounding spring frame, and the deformation can be reduced more and more from frame to frame, considered from the outside to the inside, by way of the nestled (cascaded) structure and by way of the alternating offset arrangement of the connection locations. Moreover, a very compact structure advantageously arises, and this structure permits a large deflection of the mirror plates in both axes via these cascaded spring paths.

In another advantageous embodiment example, the drive plate is connected to the carrier arrangement via at least two, preferably 3 or 4 or more annular spring frames which surround them and which form the second spring elements, in the form of a cardanic suspension. Thereby, the drive plate is connected to the spring frame directly surrounding it, the spring frames connected amongst one another, and the outermost spring frame connected to the carrier arrangement, via connection locations which are offset in each case by an angle of between 90 and 120°, preferably by 90°. Such an arrangement permits a space-saving structure and an adaptation to the desired oscillation characteristics. A cardanic suspension is provided by way of this arrangement. The complete spring length can be increased by way of increasing the number of annular spring frames, so that the spring becomes softer. Thus also four annular spring frames can be used for the biaxial mirror for example The cardanic suspension of the annular spring frames in both described cases in each case provides the positive characteristic of the coupled natural (fundamental) oscillations of both axes being better decoupled from one another.

The drive arrangement, depending on the design on the micromirror arrangement can be designed as a biaxial, electrostatic, piezoelectric and/or electromagnetic drive, wherein the selection of the type of set drive depends on the desired applications. Electromagnetic drives in comparison to the piezoelectric drives for example have the advantage that additionally to the high achievable forces, they also permit large travel, i.e. actuation paths or amplitudes. The smaller actuation paths of piezo-actuators which can be realised, however in many cases are completely sufficient in order to set the first spring-mass oscillator, matched to the natural resonance or to the natural resonance of the mirror plate, into sufficiently large oscillation. The often larger frequency bandwidth of piezo-actuators represents an advantage compared to electromagnetic drives, in particular with MEMS scanners which are to be activated in a high-frequency manner e.g. >20 kHz.

In an advantageous embodiment example, the carrier arrangement comprises a substrate, preferably an electrode chip and an actuator chip which is fixedly connected via a spacer, and with which the spring-mass oscillators are fastened on a stationary part, and in an advantageous manner the carrier arrangement is covered in a vacuum tight manner by a cover or, as the case may be, by a base wafer, for forming a vacuum-encapsulated micromirror chip, in which a getter is preferably incorporated. A minimal damping of the biaxial micromirror arrangement is achieved by the vacuum encapsulation, wherein the getter preferably produces and maintains the vacuum.

Electrodes and/or piezoelectric elements and/or coils and/or magnetic layers which are a constituent of the drive arrangement are formed on the carrier arrangement, in a manner lying opposite the drive plate or on the drive plate segments at a distance, and/or on the drive plate or on the drive plate segments. Electrodes which can be applied as position detection elements and phase detection elements can advantageously be attached on the carrier arrangement, in a manner lying opposite the drive plate or the drive plate segments at a distance, and/or on the drive plate or on the drive plate segments.

BRIEF DESCRIPTION OF THE DRAWINGS

Embodiment examples of the invention are represented in the drawings and are explained in more detail in the subsequent description. There are shown in.

DETAILED DESCRIPTION

Figure 1:
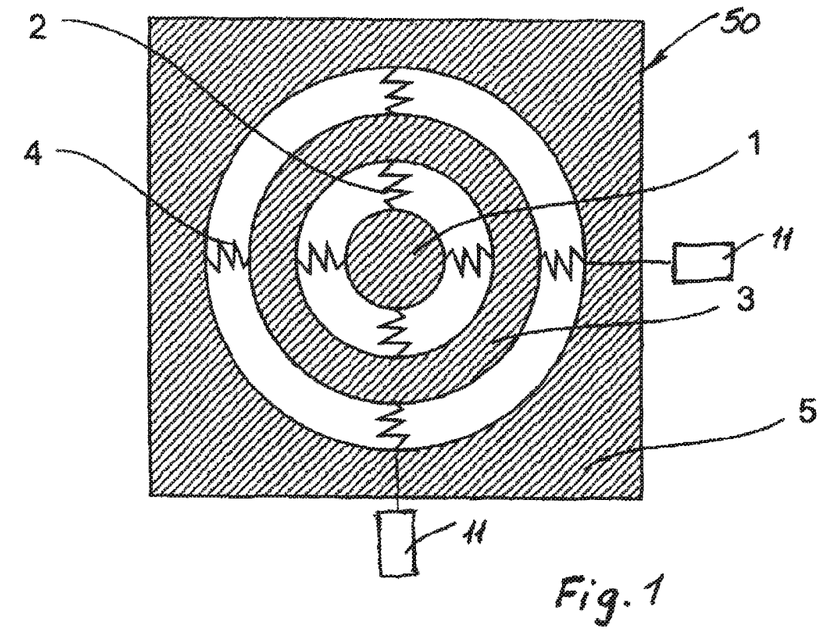
FIG. 1 a schematic view upon one embodiment example of the micromirror arrangement according to the invention, FIG. 2 a schematic sectioned view according to FIG. 1, FIG. 3 a further embodiment example of the micromirror arrangement according to the invention, in a sectioned view, FIG. 4 a plan view upon a further embodiment example of the micromirror arrangement according to the invention, FIG. 5 a sectioned view of the embodiment example according to FIG. 4, in the deflected condition of the spring-mass oscillator, FIG. 6 a view according to FIG. 5, in the idle condition of the spring-mass oscillator, with different drive elements, FIG. 7 a view of a further embodiment example of the micromirror arrangement according to the invention, FIG. 8 a view according to FIG. 6, with a differently designed drive, FIG. 9 a view upon a further embodiment example of the micromirror arrangement according to the invention and FIG. 10 a schematic view upon a micromirror arrangement according to the invention, with which the drive plate is designed as a divided drive plate elements which is to say drive plate segments.
Figure 2:
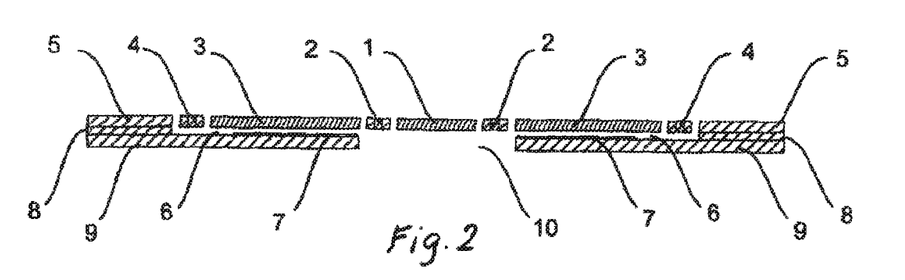

A micromirror arrangement according to the invention is schematically represented in FIGS. 1 and 2. Thereby, a mirror plate 1 is suspended in the middle of an annular drive plate 3 which surrounds it, in a biaxially movable manner via schematically indicated spring elements 2, wherein the drive plate 3 for its part is suspended in a stationary part 5 of an actuator chip formed by the mentioned elements, via spring elements, in the present case four spring elements 4. A drive arrangement 11 for the biaxial drive of the drive plate 3 is indicated only in a schematic manner. In the represented embodiment example, the mirror plate 1 as well as the drive plate 3 is designed in a circular manner, hut they can also have a different shape, e.g. a polygonal shape.

The spring elements 2 and 4, as specified, are represented schematically and they can have the most varied of shapes. They can be designed as discrete spring elements which are assigned to one axis, but also as annular springs, as described hereinafter, and the drive plate 3 can also be suspended on the stationary part 5 with only two spring elements 4 which permit a biaxial oscillation.

An electrode chip 9 in FIG. 2 is arranged below the actuator chip 50 consisting of the stationary part 5, spring elements 4 and 2 and the drive plate 3 and mirror plate 1, and is connected or bonded to the actuator chip 50 via spacers or distance keepers 8. Thereby, electrodes 7 are arranged at an electrode distance 6 to the drive plate 3, on the electrode chip 9 below the drive plate 3, by which means an at least biaxial electrostatic drive can be realised. The electrode chip 9 comprises a recess 10, so that the mirror plate 1 can achieve deflections greater than the electrode distance 6.

In another embodiment example which is not represented, it is possible not for four discrete spring elements 2 and 4 to be arranged between the mirror plate 1 and drive plate 3, and between the drive plate 3 and stationary part 5 respectively, but only three spring elements in each case. A micromirror movable in a biaxial manner can also be produced in this case.

Figure 3:
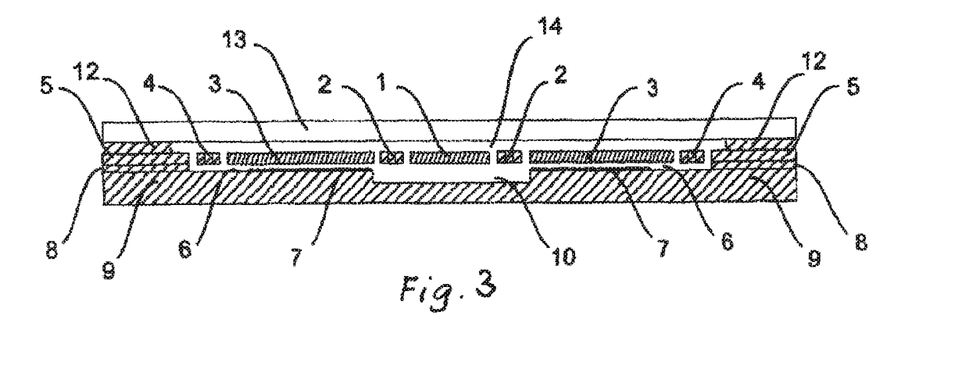

FIG. 3 shows an encapsulated micromirror arrangement according to FIG. 2, wherein spacers or distance-keepers 12 are attached above the stationary part of the actuator chip 50 by way of bonding, such that a cover 13 which is optically transparent to an incident radiation and is preferably mirrored on both sides can be attached by way of gluing or bonding or likewise. Thereby, the cover 13 can consist of glass, quartz glass, quartz, sapphire, silicon, zinc selenite or plastic and it is to be arranged at such a distance to the mirror plate 1 that the mirror plate 1 can deflect to an adequate extent. The recess 10 of the electrode chip 9 in this embodiment example is not continuous, but the electrode chip 9 simultaneously forms the base of the micromirror arrangement, and the recess is provided as a deepening in the chip 9, in a manner such that a closed cavity 14 is formed.

In another embodiment with a recess 10 which engages through the electrode chip 9, a base in the form of a base wafer or base chip can be deposited onto the lower side of the electrode chip 9 by way of bonding or gluing or likewise, so that a hermetically sealed housing results. A getter, e.g. as a metal layer on the electrode chip 9 or the separate base or as a separate getter pellet, e.g. of a zirconium-titanium composition, can be brought into the cavity 14 before the encapsulation, wherein this getter is not represented.

Figure 4:
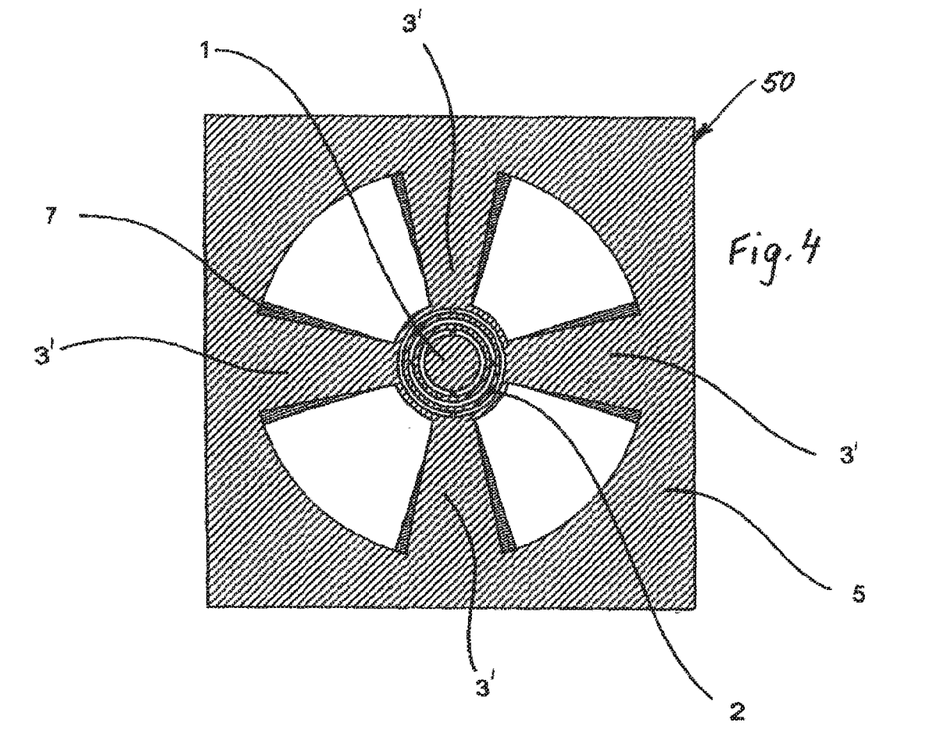

The plan view of a further embodiment example of a biaxial micromirror arrangement for an MEMS seamier is represented in FIG. 4, wherein the mirror plate 1 in turn is movably suspended in a biaxial manner via spring elements 2 in the centre of the surrounding drive plate 3. The drive plate 3 here is designed as drive plate segments 3' which for their part have spring characteristics and simultaneously form spring elements corresponding to the spring elements 4. The drive plate segments 3' run out directly into the stationary part 5 of the actuator chip 50. The spring elements 2 between the mirror plate and the drive plate segments 3' here are realised as concentrically annularly designed spring frames which are nested or cascaded in one another. Thereby, the mirror plate 1 is connected at two oppositely lying connection locations, to the innermost annular spring frame which for its part is connected to the next annular spring frame at two connection locations which in the represented embodiment example are offset by 90° to the previous connection locations. The next annular spring frames are connected to one another in a corresponding manner, wherein the outermost spring frame is coupled onto the drive plate segments 3'. Individual addressable electrodes 7 which in this embodiment example are somewhat larger than the segments 3' so that these laterally protrude beyond these, are located below the drive plate segments 3'.

With this embodiment too, it is possible for only three drive plate segments 3' to be provided for realising the biaxial micromirror arrangement, and these amongst one another are rotated to one another e.g. by an enclosed angle of 120°.

Figure 5:
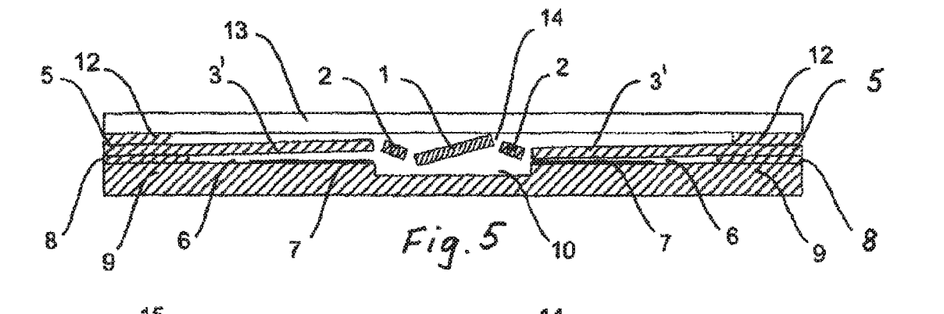

FIG. 5 essentially shows a cross section of the micromirror arrangement according to FIG. 4 in motion. The electrode 7 which is at the right in the figure, or the electrode 7 which is at the left in the figure, or also both electrodes, in the latter case with a suitable phase shift, are activated with a drive voltage which has a frequency corresponding to the resonant frequency of the mirror plate 1, for a movement of the mirror plate which is represented in this figure. The suitable phase shift for example is 180°. For this reason, e.g. voltage pulses (e.g. from 0 Volt to 50 Volt amplitude) are produced in a manner matched to the resonant frequency of the respective axis, e.g. in an alternating manner, at the two electrodes which lie opposite one another in each case. The drive plate segments 3', as represented, move in an oscillating manner with a reduced deflection to the mirror plate 1 due to such activation, and thereby produce an amplitude amplified movement of the mirror plate 1 which is counter-phased to the drive plate segments 3'. The drive voltage is led to the electrodes in each case, wherein for example only one of the two electrodes can be can serve for driving the drive plate segments 3' and the mirror plate 1, for one axis, whereas the second electrode can be used for the capacitive position detection and phase detection. The capacitance which changes in a manner dependent on the varying distance between the electrode 7 and the drive plate segment 3' can be evaluated for this. However, if a high drive force is to be produced, then both electrodes 7 are applied for the drive, for one axis.

Figure 6:
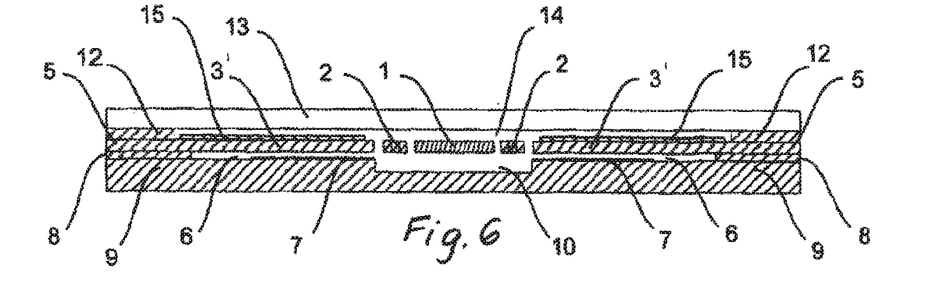

FIG. 6 shows a micromirror arrangement according to the invention, which is not only driven by electrostatic forces, but also or only by piezoelectric forces. For this, piezo-actuator layers 15 are located on the drive plate segments 3', and these bend on applying a drive voltage and by way of this set the drive plate segments 3' and thus indirectly also the mirror plate 1 in motion. The capacitance which is formed by the electrodes 7 and the drive plate segments 3' can either be used for additional electrostatic force production or however again for evaluating the position and phase position of the drive plate segments 3'.

Figure 7:
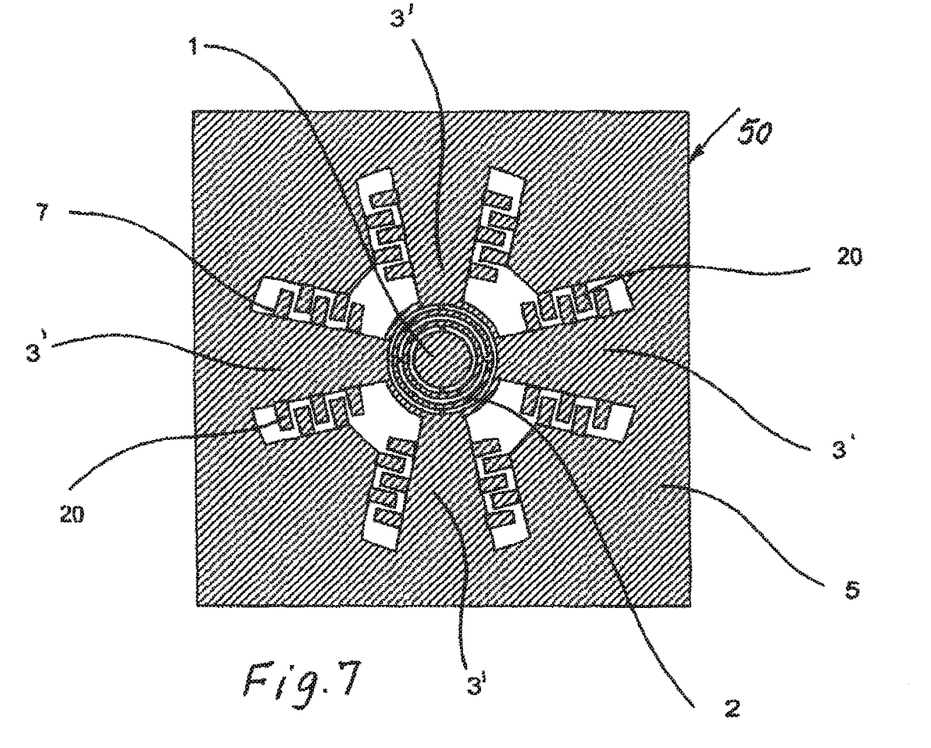

A plan view of a further embodiment example of the micromirror arrangement according to the invention is represented in FIG. 7 and this corresponds to the embodiment according to FIG. 4, with which however another embodiment of an electrostatic drive is used. In this case, comb electrodes 20 which with corresponding electrodes attached on the stationary part 5 of the actuator chip 50 form an electrostatic comb drive, are attached on the drive plate segments which simultaneously serve as spring elements and which are deflected.

Figure 8:
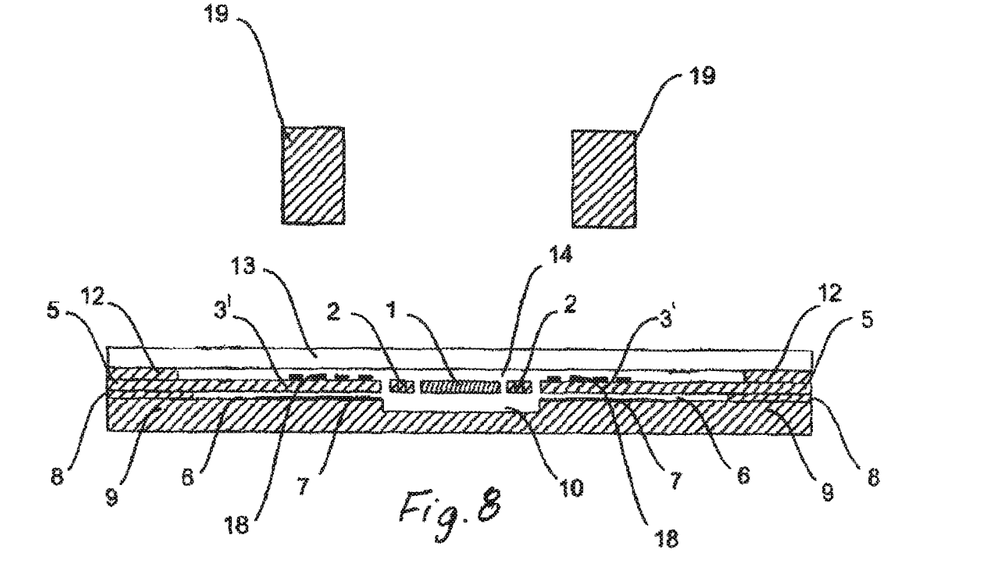

A further embodiment example of a micromirror arrangement is represented in FIG. 8, with which an electromagnetic drive is used. This drive comprises permanent magnets 19 which are attached outside the encapsulated arrangement, and planar coils 18 which are subjected to current, are attached on one of the drive plate segments 3' in each case and can be individually activated. When the planar coils are subjected to current, a force is produced on interaction with the permanent magnets 19 and this three moves the drive plate segments 3' out of their plane. The mirror plate is finally again made to resonate by way of activating the current flow through the planar coils 18 with a frequency corresponding to the eigenmodes of the mirror plate 1. As was hitherto the case, the electrodes 7 can be applied for an additional production of force or for detection purposes of the phase and the position of the drive plates.

In an embodiment example which is not represented, soft or hard magnetic layers are deposited onto the drive plate 3 or the drive plate segments 3', and actuatable electromagnets are used instead of the permanent magnets 19 in FIG. 8, wherein the activation is carried out in a manner such that a magnetic field which is temporally modulated with the resonant frequency of the mirror plate 1 is produced, and this magnetic field permits the drive plates 3 or the drive plate segments 3' to oscillate, so that the mirror plate 1 preferably oscillates in a manner counter-phased to the drive plate and thereby undergoes an amplitude amplification.

Figure 9:
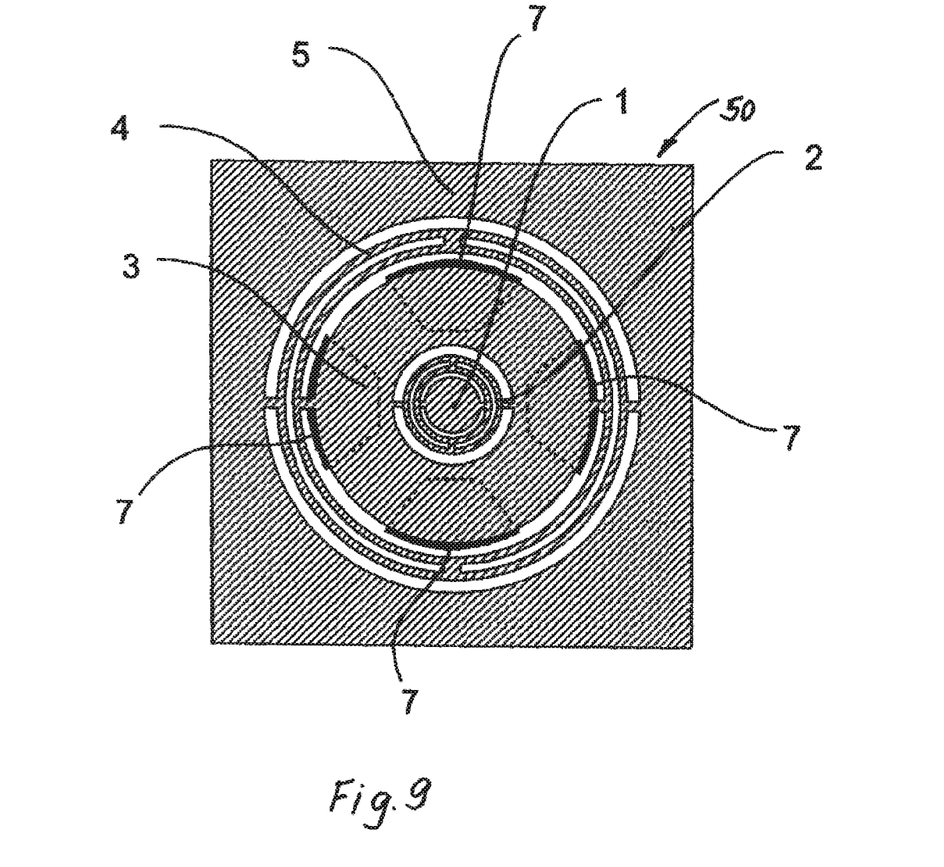

With the embodiment example according to FIG. 9 which shows a plan view upon the micromirror arrangement, the mirror plate is again fastened on an annular drive plate 3 via a spring structure of annular spring frames having offset connection locations, wherein this structure is nested in one another. This annular drive plate for its part, in the represented embodiment example, is suspended on the stationary part 5 of the actuator chip 50 in a manner movable about two axes, via two spring frames or spring rings 4. The drive plate 3 can be set into oscillation in each of the two axes in a targeted manner via four activation electrode 7 which are arranged at a distance on the electrode chip, wherein this electrode chip cannot be recognised. A counter-phased oscillation of the mirror plate 1 and the drive plate 3 can be produced by way of matching the activation frequencies of the electrodes 7 to two natural resonant frequencies of the mirror plate 1, and be utilised for amplitude amplification.

Figure 10:
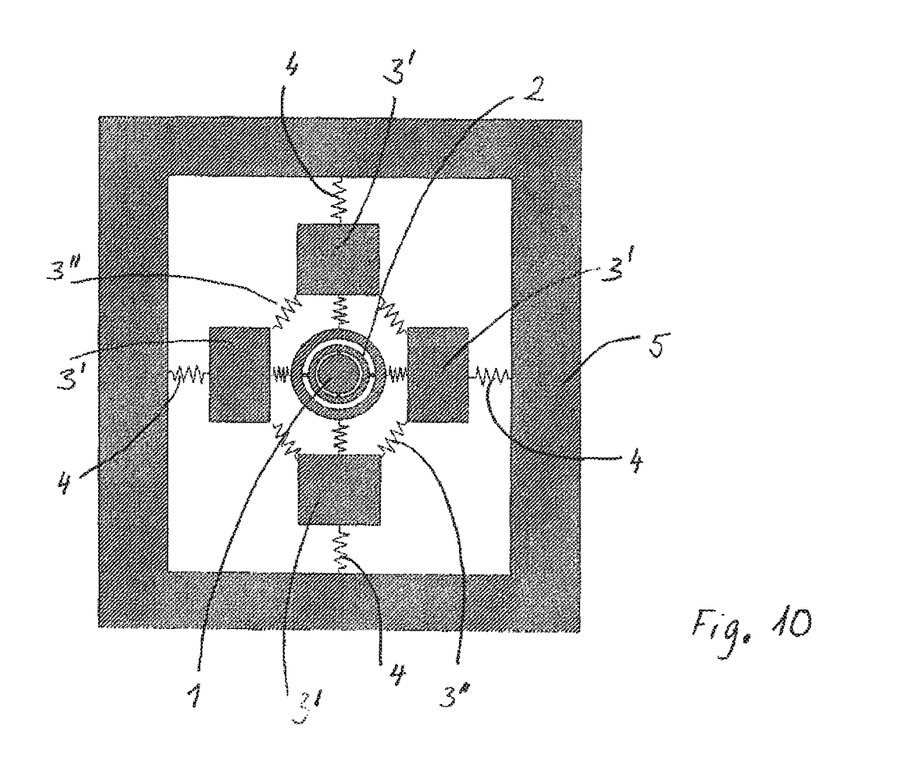

The embodiment example with the drive plate 3 which is divided into drive plate elements or segments 3' is represented schematically once again in FIG. 10. The drive elements are decoupled from one another to an even greater extent via spring connections 3", and are connected to the rigid frame 5 via a second spring element 4. The schematic representation with regard to FIG. 1 can be understood as if the drive plate 3 in FIG. 1 were to be divided into four segments which amongst one another have no rigid connection, but have the spring connections 3". An embodiment according to FIG. 10 leads to an improved separation of the oscillations of the two axes.

In the previously described embodiment examples, in each case partly different embodiment have been described for spring elements and the drive and likewise. These however are not assigned to the specific embodiments, but can also be accordingly applied with the other embodiment examples.

The invention claimed is:

1. A micromirror arrangement comprising
    a first spring-mass oscillator comprising an oscillation body forming a mirror plate, and comprising first spring elements;
    a second spring-mass oscillator which comprises a drive plate and second spring elements and is connected to a carrier arrangement via the second spring elements,
    wherein the first spring-mass oscillator is suspended in the second spring-mass oscillator via the first spring elements, and
    a drive arrangement which is assigned to the drive plate and is designed to excite the drive plate into oscillation,
    characterised in that the oscillation body is movably suspended on the drive plate in a biaxial manner via the first spring elements, and the drive plate is connected to the carrier arrangement in a biaxially movable manner,
    wherein the drive arrangement is designed as a biaxial drive and is designed to drive the drive plate in a biaxial manner such that the oscillation body oscillates in a biaxial manner in each case with one of its orthogonal eigenmodes or close to these eigenmodes,
    the drive plate is designed as several drive plate segments, which simultaneously form the second spring elements and
    the oscillation body is suspended on the drive plate via at least two, preferably three, four or more spring elements which are designed as annular spring frames and which form a cardanic suspension.

2. The micromirror arrangement according to claim 1, wherein the drive arrangement is designed to drive the drive plate in a manner such that the oscillation body and the drive plate oscillate in a counter-phased manner.

3. The micromirror arrangement according to claim 1, wherein the oscillation body is suspended on the drive plate via three or four discrete first spring elements.

4. The micromirror arrangement according to claim 1, wherein the drive plate is suspended on the carrier arrangement via at least two, preferably three or four discrete second spring elements or at least two, preferably more spring elements which are designed as annular spring frames.

5. The micromirror arrangement according to claim 1, wherein the first spring elements are designed as several, preferably three or four or more annular spring frames which are nested in one another, surrounding the oscillation body, and at least two connection locations in each case are connected to the oscillation body, are connected amongst one another and are connected to the drive plate, wherein the connection locations from the oscillation body to the drive plate are offset by an angle between 90 to 120°, preferably 90°.

6. The micromirror arrangement according to claim 1, wherein the drive arrangement is designed as a biaxial, electrostatic, piezoelectric and/or electromagnetic drive.

7. The micromirror arrangement according to claim 1, wherein the carrier arrangement comprises a substrate, preferably an electrode chip, and an actuator chip which is fixedly connected via a spacer, with which the spring mass oscillators are fastened on a stationary part, and the carrier arrangement is covered by a cover and, as the case may be, by a base, in a vacuum-tight manner for forming a vacuum-encapsulated micromirror chip, wherein a getter is preferably incorporated into the micromirror chip.

8. The micromirror arrangement according to claim 1, wherein electrodes and/or piezoelectric elements and/or coils and/or magnetic layers are attached on the carrier arrangement in a manner lying opposite the drive plate segments, and/or are attached on the drive plate segments.

9. The micro mirror arrangement according to claim 1, wherein the electrodes which serve as position detection elements and phase detection elements for determining the phase and the position of the drive plate are attached on the carrier arrangement of the drive plate or on the drive plate elements, at a distance lying opposite the drive plate or drive plate segments.

10. A micromirror arrangement comprising
    a first spring-mass oscillator comprising an oscillation body forming a mirror plate, and comprising first spring elements;
    a second spring-mass oscillator which comprises a drive plate and second spring elements and is connected to a carrier arrangement via the second spring elements,
    wherein the first spring-mass oscillator is suspended in the second spring-mass oscillator via the first spring elements, and
    a drive arrangement which is assigned to the drive plate and is designed to excite the drive plate into oscillation,
    wherein the oscillation body is movably suspended on the drive plate in a biaxial manner via the first spring elements, and the drive plate is connected to the carrier arrangement in a biaxially movable manner,
    wherein the drive arrangement is designed as a biaxial drive and is designed to drive the drive plate in a biaxial manner such that the oscillation body oscillates in a biaxial manner in each case with one of its orthogonal eigenmodes or close to these eigenmodes,
    the oscillation body is suspended on the drive plate via at least two, preferably three, four or more spring elements which are designed as annular spring frames and which form a cardanic suspension and the drive plate is suspended on the carrier arrangement via at least two, preferably more spring elements which are designed as annular spring frames surrounding the drive plate.

11. The micromirror arrangement according to claim 10, wherein the drive plate is designed as a ring frame surrounding the oscillation body.

12. The micromirror arrangement according to claim 10, wherein the oscillation body is suspended on the drive plate via three or four discrete first spring elements.

13. The micromirror arrangement according to claim 10, wherein the first spring elements are designed as several, preferably three or four or more annular spring frames which are nested in one another, surrounding the oscillation body, and at least two connection locations in each case are connected to the oscillation body, are connected amongst one another and are connected to the drive plate, wherein the connection locations from the oscillation body to the drive plate are offset by an angle between 90 to 120°, preferably 90°.

14. The micromirror arrangement according to claim 10, wherein the drive plate is connected to the carrier arrangement via at least two or more spring frames which surround the drive plate, wherein the drive plate is connected to the spring frame directly surrounding it, the spring frames are connected amongst one another and the outermost spring frame connected to the carrier arrangement, via connection locations which are in each case offset by an angle between 90 and 120°, preferably by 90°.

* * * * *